US007888847B2

(12) United States Patent
Dietz et al.

(10) Patent No.: US 7,888,847 B2
(45) Date of Patent: Feb. 15, 2011

(54) APODIZING ULTRASONIC LENS

(76) Inventors: Dennis Raymond Dietz, 7038 S. Louthan Cir., Littleton, CO (US) 80120; Clyde Gerald Oakley, 7308 S. Xanthia St., Centennial, CO (US) 80112; Duane Morgan, 14782 E. Colgate Dr., Aurora, CO (US) 80014; Daidipya Patwa, 15 S. Clarkson St., Apt. 207, Denver, CO (US) 80209

( * ) Notice: Subject to any disclaimer, the term of this patent is extended or adjusted under 35 U.S.C. 154(b) by 967 days.

(21) Appl. No.: 11/594,553

(22) Filed: Nov. 7, 2006

(65) Prior Publication Data

US 2008/0156577 A1 Jul. 3, 2008

Related U.S. Application Data

(60) Provisional application No. 60/862,757, filed on Oct. 24, 2006.

(51) Int. Cl.
*H01L 41/08* (2006.01)

(52) U.S. Cl. ....................... 310/334; 181/176; 600/457; 600/459

(58) Field of Classification Search ................. 310/334; 181/176; 600/457, 459
See application file for complete search history.

(56) References Cited

U.S. PATENT DOCUMENTS

| | | | | |
|---|---|---|---|---|
| 3,387,604 | A | 2/1965 | Erikson | |
| 3,618,696 | A | 11/1971 | Hurwitz | |
| 3,866,711 | A * | 2/1975 | Folds | 181/176 |
| 3,958,559 | A | 5/1976 | Glenn et al. | |
| 4,001,766 | A | 1/1977 | Hurwitz | |
| 4,327,738 | A | 5/1982 | Green et al. | |
| 4,387,720 | A * | 6/1983 | Miller | 600/472 |
| 4,503,861 | A | 3/1985 | Entrekin | |
| 4,659,956 | A | 4/1987 | Trzaskos et al. | |
| 4,880,012 | A | 11/1989 | Sato | |
| 5,083,568 | A | 1/1992 | Shimazaki et al. | |
| 5,127,410 | A | 7/1992 | King et al. | |
| 5,181,514 | A | 1/1993 | Solomon et al. | |
| 5,235,553 | A | 8/1993 | Garlick et al. | |
| 5,285,789 | A | 2/1994 | Chen et al. | |
| 5,301,168 | A | 4/1994 | Miller | |
| 5,423,220 | A | 6/1995 | Finsterwald et al. | |

(Continued)

FOREIGN PATENT DOCUMENTS

| | | |
|---|---|---|
| DE | 103 06 795 | 9/2004 |

(Continued)

*Primary Examiner*—J. SanMartin
(74) *Attorney, Agent, or Firm*—Richard W. Ellis

(57) ABSTRACT

An improved acoustic lens and an improved ultrasonic transducer system comprising an improved acoustic lens and related methods are provided. The improved acoustic lens may have a uniform loss along an elevation axis or may have a loss along the elevation axis that provides for an apodization of an acoustic signal. The improved acoustic lens may be a multi-component lens. In a two-component lens embodiment, the inner lens component, for interfacing with a transducer, may have a concave outer surface and the outer lens component may have a flat or convex outer surface. In a three-component lens embodiment, the inner lens component, for interfacing with a transducer, may have a concave outer surface, the middle lens component may have a concave outer surface and the outer lens component may have a flat or convex outer surface.

14 Claims, 12 Drawing Sheets

U.S. PATENT DOCUMENTS

| | | | | |
|---|---|---|---|---|
| 5,434,827 | A | 7/1995 | Bolorforosh | |
| 5,465,724 | A | 11/1995 | Sliwa, Jr. et al. | |
| 5,488,957 | A | 2/1996 | Frey et al. | |
| 5,511,550 | A | 4/1996 | Finsterwald | |
| 5,553,035 | A | 9/1996 | Seyed-Bolorforosh et al. | |
| 5,577,507 | A * | 11/1996 | Snyder et al. | 600/472 |
| 5,738,098 | A | 4/1998 | Brock-Fisher et al. | |
| 5,743,855 | A | 4/1998 | Hanafy et al. | |
| 5,820,564 | A | 10/1998 | Slayton et al. | |
| 5,834,687 | A * | 11/1998 | Talbot et al. | 174/386 |
| 5,846,205 | A | 12/1998 | Curley et al. | |
| 5,882,309 | A | 3/1999 | Chiao et al. | |
| 5,922,962 | A | 7/1999 | Ishrak et al. | |
| 5,976,090 | A | 11/1999 | Hanafy et al. | |
| 5,976,091 | A | 11/1999 | Hanafy | |
| 5,984,871 | A | 11/1999 | TenHoff et al. | |
| 6,194,814 | B1 * | 2/2001 | Hanafy et al. | 310/334 |
| 6,258,034 | B1 | 7/2001 | Hanafy | |
| 6,443,900 | B2 | 9/2002 | Adachi et al. | |
| 6,618,206 | B2 | 9/2003 | Tarakci et al. | |
| 6,666,825 | B2 | 12/2003 | Smith et al. | |
| 6,791,240 | B2 | 9/2004 | Mauchamp et al. | |
| 7,569,012 | B2 * | 8/2009 | Tanaka et al. | 600/129 |
| 2001/0021807 | A1 * | 9/2001 | Saito et al. | 600/437 |
| 2003/0076599 | A1 | 4/2003 | Tarakei et al. | |
| 2003/0225346 | A1 | 12/2003 | Ein-Gal | |
| 2005/0245829 | A1 * | 11/2005 | Wakabayashi | 600/459 |
| 2009/0299194 | A1 * | 12/2009 | Matsuzawa | 600/459 |

FOREIGN PATENT DOCUMENTS

| | | |
|---|---|---|
| EP | 0 130 709 | 9/1985 |
| EP | 0 212 352 | 3/1987 |
| EP | 0 486 815 | 5/1992 |
| EP | 0 489 222 | 10/1992 |
| EP | 0 631 272 | 12/1994 |
| EP | 1 445 758 | 8/2004 |
| EP | 1 591 996 | 11/2005 |

* cited by examiner

APODIZING ULTRASONIC LENS

RELATED APPLICATIONS

This application claims priority from U.S. Provisional Patent Application Ser. No. 60/862,757, filed Oct. 24, 2006, entitled "Improved Ultrasonic Transducer System," and the entire disclosure of which is incorporated by reference in its entirety herein.

FIELD OF THE INVENTION

The present invention relates to ultrasound imaging probes, and more particularly to improved ultrasonic transducer systems and related methods.

BACKGROUND OF THE INVENTION

Ultrasound imaging probes continue to enjoy widespread use in the medical field. By way of example, ultrasound probes are utilized for a wide variety of external, laparoscopic, endoscopic and intravascular imaging applications. The ultrasound images provided by imaging probes may, for example, be used for diagnostic purposes.

Ultrasound imaging probes typically include a plurality of parallel piezoelectric transducer elements arranged along a longitudinal axis, with each element interconnected to a pair of electrodes. Typically, the transducers are subdivided in the longitudinal direction by dicing during production, resulting in independent transducer elements that enable electronic steering, focusing, and apodization within an imaging plane. An electronic circuit, interconnected to the electrodes excites the transducer elements, causing them to emit ultrasonic energy. The transducer elements may be operable to convert received ultrasonic energy into electrical signals, which may then be processed and used to generate images.

Focusing in the elevation direction, which is perpendicular to the imaging plane, is typically achieved through mechanical means. Commonly, an acoustic lens is placed in front of the transducer elements and provides for a single fixed focus in the elevation direction. However, this typically results in the creation of undesirable side lobes in the amplitude distribution at the focal point of the acoustic lens. These side lobes may result in reduced image quality. To increase image quality, attempts have been made to modify the ultrasonic beam along the elevation axis to reduce side lobes. Known systems, for example, have used multiple transducer elements along the elevation axis, transducer element surfaces curved along the elevation axis, or acoustic blocking materials to attempt to reduce side lobes. Typically, these attempts have increased the cost and complexity of their respective ultrasonic imaging systems.

As the applications for, and use of, ultrasound imaging probes continue to expand, so does the need for ultrasound probe designs that yield higher imaging performance and/or increased production efficiencies. In this regard, the ability to realize enhanced performance and production efficiencies related to ultrasound imaging probes through improvements to components of ultrasound imaging probes becomes particularly significant.

SUMMARY OF THE INVENTION

In view of the foregoing, an object of the present invention is to provide an improved ultrasound transducer system that is operable to yield improved acoustic wave characteristics. An additional object is to provide an improved ultrasound transducer system that may be produced in an efficient manner.

The above objectives and additional advantages are realized by the present invention. In one aspect, an acoustic lens includes a first lens element and a second lens element. The first lens element has a back surface and a front surface. Similarly, the second lens element has a back surface and a front surface. The back surface of the second lens element is acoustically coupled with the front surface of the first lens element. The ratio of acoustic loss per unit thickness of the first lens element to the acoustic loss per unit thickness of the second lens element may be at least about 2 to 1.

The first lens element may be composed of a different material or different materials than that of the second lens element. The first and second lens elements may be composed of the same materials. In embodiments where the first and second lens elements are composed of the same materials, the relative percentage by weight of a particular material contained within the first lens element may be different than the relative percentage by weight of that material within the second lens element. The various materials or combinations of materials used in the first and second lens elements may, for example, be selected to yield various performance attributes.

In various embodiments described herein, the first lens element may be comprised of a polymer-based material. In various implementations, the polymer-based material of the first lens element may include material selected from a group consisting of: polyurethane, epoxy material and silicone. The silicone may be in the form of silicone rubber. The epoxy material may be formed from epoxy resins, for example, through curing methods or reactive processes known to those skilled in the art. In various embodiments described herein, the second lens element may be comprised of a polymer-based material. In various implementations, the polymer-based material of the second lens element may include material selected from a group consisting of: polyurethane, epoxy material and silicone. The silicone of the second lens element may be in the form of silicone rubber and the epoxy material of the second lens element may be formed from epoxy resins. In an embodiment, the first lens element may be comprised of polyurethane and the second lens element may be comprised of silicone. In one example, the first lens element may be made of substantially 100% polyurethane and the second lens element may be made of substantially 100% silicone rubber. Material different than the primary material of the lens to which it is added, may be added to the first and second lens elements to alter their acoustic properties (e.g., to increase or decrease loss per unit thickness). For example, tungsten powder may be added to the material used to make one of the lens elements prior to curing. The tungsten powder may be mixed into the material and be distributed uniformly throughout the material so that the tungsten powder is suspended in a matrix of the cured lens element. The first lens element may include a matrix containing suspended tungsten particles, which may serve to increase the loss per unit thickness of the first lens element. This may produce a first lens element with a higher acoustic loss per unit thickness relative to the second lens element. In one example, the first lens element may be composed of tungsten powder suspended in a matrix made of substantially 100% polyurethane.

As noted, a material different than the primary material of the lens to which it is added may be added to a lens element to alter acoustic properties. For example, glass microballoons may be added to one of the lens elements to reduce the loss per unit thickness through that lens element. Glass microballoons may be added to silicone (e.g., silicone rubber), which may then be used to form the second lens element. This may produce a second lens element with a lower acoustic loss per unit thickness relative to the first lens element.

The material used in the first lens element of various embodiments described herein provides for a first acoustic propagation velocity. Likewise, the material used in the second lens element provides for a second acoustic propagation velocity. In various arrangements, the acoustic propagation velocity of the first lens element may be between about 0.7 and 2.5 mm/microsecond and the acoustic propagation velocity of the second lens element may be between about 0.7 and 2.5 mm/microsecond.

To provide for refraction at the interface between the first lens element and the second lens element, the first acoustic propagation velocity may be different than the second acoustic propagation velocity. In an embodiment, the first acoustic propagation velocity may be greater than the second acoustic propagation velocity.

The first lens element may be operable to apodize an acoustic signal propagating through the acoustic lens. As utilized herein, apodization refers to reducing the side lobes of an acoustic field pattern by varying the amplitude of the acoustic field in the plane of the transducer. Attenuating the edges of the acoustic field in the aperture plane, as compared to the center, reduces side lobe energy. By way of example, apodization may improve the quality of an image created through use of the present invention. In the present embodiment, the second lens element may reverse apodize the acoustic signal propagated through the acoustic lens (e.g., losses through the second lens element may be greater along a centerline of the lens). Since the acoustic loss per unit thickness through the first lens element may be different than that of the second lens element, and the acoustic loss per unit thickness through both the first and second lens elements may be controlled, the net effect on the acoustic signal propagating through the acoustic lens may be controlled. In an embodiment, the acoustic lens may be operable to uniformly attenuate an acoustic signal propagated through the acoustic lens. Alternatively, the acoustic lens may be operable to apodize an acoustic signal propagated through the acoustic lens.

In various embodiments, the front surface of the first lens element may be concave. The back surface of the second lens element may have a radius of curvature to match the front surface of the first lens element so that the two surfaces are conformal (e.g., in continuous mating contact). The front surface of the second lens element may be flat or convex. The front surface of the second lens element may be operable to interface with the outer surface of a patient.

In another aspect of the present invention, an ultrasonic transducer system includes at least one ultrasonic transducer element and an acoustic lens acoustically coupled to an acoustic face of the at least one ultrasonic transducer element. In this regard, the present aspect includes single-element ultrasonic transducer systems and ultrasonic transducer systems that include a plurality of elements. In ultrasonic transducer systems that include a plurality of elements, the ultrasonic transducer elements may be arranged in a one-dimensional array with the elements arranged along a longitudinal axis. The ultrasonic transducer elements may be arranged in other configurations such as multirow arrays and two-dimensional arrays. An elevation axis may be orthogonal to the longitudinal axis. Each acoustic face of each of the at least one ultrasonic transducer elements may have a first end, a second end, and a central point along the elevation axis with the central point lying between the first and second ends. The acoustic lens of the current aspect may include a first lens element and a second lens element. The acoustic lens may have an acoustic loss with respect to energy emanating from each of the first end and the second end of the acoustic face that is at least as great as an acoustic loss with respect to energy emanating from a central point of the acoustic face.

The ultrasonic transducer elements may be arranged along a curvature along the longitudinal axis. In an embodiment of the current aspect, the individual ultrasonic transducer elements are planar. In an alternate embodiment, the individual ultrasonic transducer elements may be curved along the elevation axis, the longitudinal axis, or a combination thereof.

In an embodiment of the current aspect, the first lens element has a front surface and a back surface and the second lens element has a front surface and a back surface. The back surface of the first lens element may be acoustically coupled to the acoustic face and the back surface of the second lens element may be acoustically coupled to the front surface of the first lens element.

In various embodiments, the front surface of the first lens element may be concave in that the thickness of the first lens element may increase with distance along the elevation axis from the central point. The front surface of the second lens element may be flat or convex.

In another aspect of the present invention, a transducer system includes at least one ultrasonic transducer element and an acoustic lens. The acoustic lens includes a first lens element with a back surface and a front surface and a second lens element with a back surface and a front surface. The at least one ultrasonic transducer element includes an acoustic face having an elevation axis. In the current aspect, the back surface of the first lens element may be acoustically coupled to the acoustic face and the front surface of the first lens element may be concave along the elevation axis. The back surface of the second lens element may be acoustically coupled to the front surface of the first lens element. In the present aspect, the maximum width of the first lens element along the elevation axis may be at least equal to the maximum width of the second lens element along the elevation axis. The acoustic lens may have a first end and a second end along the elevation axis. A maximum acoustic loss through the acoustic lens may substantially occur at at least one of the first end and the second end.

In another aspect of the present invention, an ultrasonic transducer system includes at least one ultrasonic transducer element having an acoustic face and an acoustic lens that includes a first lens element, a second lens element, and a third lens element. Each of the lens elements has a back surface and a front surface. The back surface of the first lens element may be acoustically coupled to the at least one ultrasonic transducer element. The front surface of the first lens element may be acoustically coupled to the back surface of the second lens element and the front surface of the second lens element may be acoustically coupled to the back surface of the third lens element.

Any one of the three lens elements may be composed of a different material or different materials than that of at least one of the other lens elements. Any two, or all three, of the three lens elements may be composed of the same materials. In embodiments where a pair or all three of the lens elements are composed of the same materials, the relative percentage by weight of a particular material contained within one of the lens elements may be different than the relative percentage by weight of that material within another of the lens elements composed of the same materials.

The first lens element may be comprised of a polymer-based material. The polymer-based material of the first lens element may include material selected from a group consisting of: polyurethane, epoxy material and silicone (e.g., silicone rubber). The second lens element may be comprised of a polymer-based material. The polymer-based material of the second lens element may include material selected from a group consisting of: polyurethane, epoxy material and silicone (e.g., silicone rubber). The third lens element may be comprised of a polymer-based material. The polymer-based material of the third lens element may include material selected from a group consisting of: polyurethane, epoxy material and silicone (e.g., silicone rubber). In an embodiment, the first lens element may be comprised of polyurethane, the second lens element may be comprised of polyurethane with different physical properties (e.g., density and acoustic propagation velocity) than the material of the first lens element, and the third lens element may be comprised of silicone rubber. Material (such as tungsten powder or glass microballoons previously described) may also be added to the first lens element, second lens element, third lens element, or combination thereof to alter their respective acoustic properties. In this regard acoustic properties such as acoustic loss per unit thickness of material of each of the lens elements may be controlled. A ratio of acoustic loss per unit thickness of the first lens element to acoustic loss per unit thickness of the second lens element may be at least about 3 to 1. A ratio of acoustic loss per unit thickness of the first lens element to acoustic loss per unit thickness of the third lens element may be at least about 3 to 1. In one example, the first lens element may be made of tungsten powder suspended in a matrix of substantially 100% polyurethane, the second lens element may be made of substantially 100% polyurethane, and the third lens element may be made of substantially 100% silicone rubber.

The material used in the first lens element provides for a first acoustic propagation velocity. Likewise, the material used in the second lens element provides for a second acoustic propagation velocity and the material used in the third lens element provides for a third acoustic propagation velocity. To provide for refraction at the interface between the various lens elements, the second acoustic propagation velocity may be different than either the first or third acoustic propagation velocity. The second acoustic propagation velocity may be greater than both the first acoustic propagation velocity and the second acoustic propagation velocity. The third propagation velocity may be lower than that of human tissue, which, for example, may allow an optional curvature of the front surface of the third lens element in contact with a patient to provide a predeterminable level of refraction.

In an embodiment of the current aspect, the first lens element may be operable to apodize an acoustic signal propagating through the acoustic lens. Similarly, the combination of the first lens element and the second lens element may be operable to apodize an acoustic signal propagating through the acoustic lens. Moreover, the acoustic lens may be operable to uniformly attenuate an acoustic signal propagated through the acoustic lens or the acoustic lens may be operable to apodize an acoustic signal propagated through the acoustic lens.

In various embodiments of the current aspect, the front surface of the first lens element may be concave. The back surface of the second lens element may have a radius of curvature to match the front surface of the first lens element so that the two surfaces are conformal (e.g., in continuous mating contact) and acoustically coupled. The front surface of the second lens element may be concave. The back surface of the third lens element may have a radius of curvature to match the front surface of the second lens element so that the two surfaces are in continuous mating contact and acoustically coupled. The front surface of the third lens element may be flat or convex. The front surface of the third lens element may be operable to interface with the outer surface of a patient. Each interface between lens elements, along with the front surface of the third lens element, may be operable to refract acoustic energy propagating through the lens. The net effect may be to focus the acoustic energy at a predetermined point.

In still another aspect of the present invention, a method of modifying an acoustic wave is provided. The method includes apodizing an acoustic wave by passing the acoustic wave through a first lens element acoustically coupled to a source of the acoustic wave and focusing the acoustic wave by passing it through an interface between the first lens element and a second lens element. The ratio of acoustic loss per unit thickness of the first lens element to that of the second lens element may be at least about 2 to 1. The acoustic wave may be further focused by passing it through an interface between the second lens element and a surface of a patient.

In yet another aspect of the present invention, a method of modifying an acoustic wave is provided. The method includes apodizing an acoustic wave by passing it through an acoustic lens acoustically coupled to an acoustic wave source and focusing the wave. The focusing may occur in at least two separate stages. In the first stage, the acoustic wave is refracted to a first focal length by passing the acoustic wave through a first interface between a first lens element and a second lens element of the acoustic lens. In the second stage, the acoustic wave is refracted to a second focal length by passing the acoustic wave through a second interface between the second lens element of the acoustic lens and a third lens element of the acoustic lens. The acoustic wave may be further focused by passing it through an interface between the third lens element and a surface of a patient.

In still another aspect of the present invention, a method of designing an acoustic lens for use in an ultrasonic transducer system is provided. The method includes selecting a desired degree of apodization, selecting a desired outer curvature of the system, determining a degree of curvature and loss per unit thickness of a first lens element to produce the selected degree of apodization, selecting a desired focal length for the system, and determining a radius of curvature of an interface between a second lens element and a third lens element to achieve the desired focal length. The acoustic lens designed with this method may include a three-element lens where the first lens element is acoustically coupled to an acoustic face of a transducer, the second lens element is acoustically coupled to the first lens element, and the third lens element is acoustically coupled to the second lens element. The outer curvature of the third lens element may be operable to interface with a surface of a patient. The interface between the first lens element and the second lens element may be convex with respect to the first lens element.

In a further aspect of the present invention, an ultrasonic transducer system includes at least one ultrasonic transducer element and an acoustic lens. The at least one ultrasonic transducer element may include a substantially planar acoustic face with an elevation axis. The acoustic lens may include a back surface acoustically coupled to the acoustic face and a front surface. The front surface may be concave along the elevation axis. An aperture plane may be adjacent to the front surface of the acoustic lens. The ultrasonic transducer system may be operable to generate an acoustic wave having an amplitude distribution such that the amplitude at the center of the aperture plane along the elevation axis is equal to or greater than the amplitude at an edge of the aperture plane along the elevation axis.

In yet another aspect of the present invention, an ultrasonic transducer system includes an acoustic lens wherein the acoustic loss through the acoustic lens may change as a function of elevation or azimuth. In this regard, the acoustic lens may apodize acoustic signals generated at the acoustic face.

In another aspect of the present invention, an ultrasonic transducer system includes at least one ultrasonic transducer element having an acoustic face and an acoustic lens having a back surface acoustically coupled to the acoustic face. A front surface of the acoustic lens may be concave along an elevation axis. The ultrasonic transducer system may be operable to generate an acoustic wave having an amplitude distribution that does not vary by more than 10 percent across an aperture plane along the elevation axis.

In still another aspect of the present invention, a method of improving contrast resolution of an ultrasound imaging system in a region between about 70% and about 130% of the focal length of an elevation axis is provided. This method includes apodizing an acoustic wave by passing it through a first lens element acoustically coupled to a source of the acoustic wave, and focusing the acoustic wave by passing through an interface between the first lens element and a second lens element. The method may further include further focusing the acoustic wave by passing the acoustic wave through an interface between the second lens element and a surface of a patient. Alternatively, the method may further include further focusing the acoustic wave by passing the acoustic wave through an interface between the second lens element and a third lens element and then passing the acoustic wave through an interface between the third lens element and a surface of a patient.

In another aspect of the present invention, an ultrasonic transducer system includes at least one ultrasonic transducer element having an acoustic face and an acoustic lens having a back surface acoustically coupled to the acoustic face. The acoustic lens may have an edge-to-center apodization ratio at an aperture plane along an elevation axis of at least 3 dB.

Additional aspects and corresponding advantages of the present invention will be apparent to those skilled in the art upon consideration of the further description that follows.

DETAILED DESCRIPTION OF THE INVENTION

Figure 1:
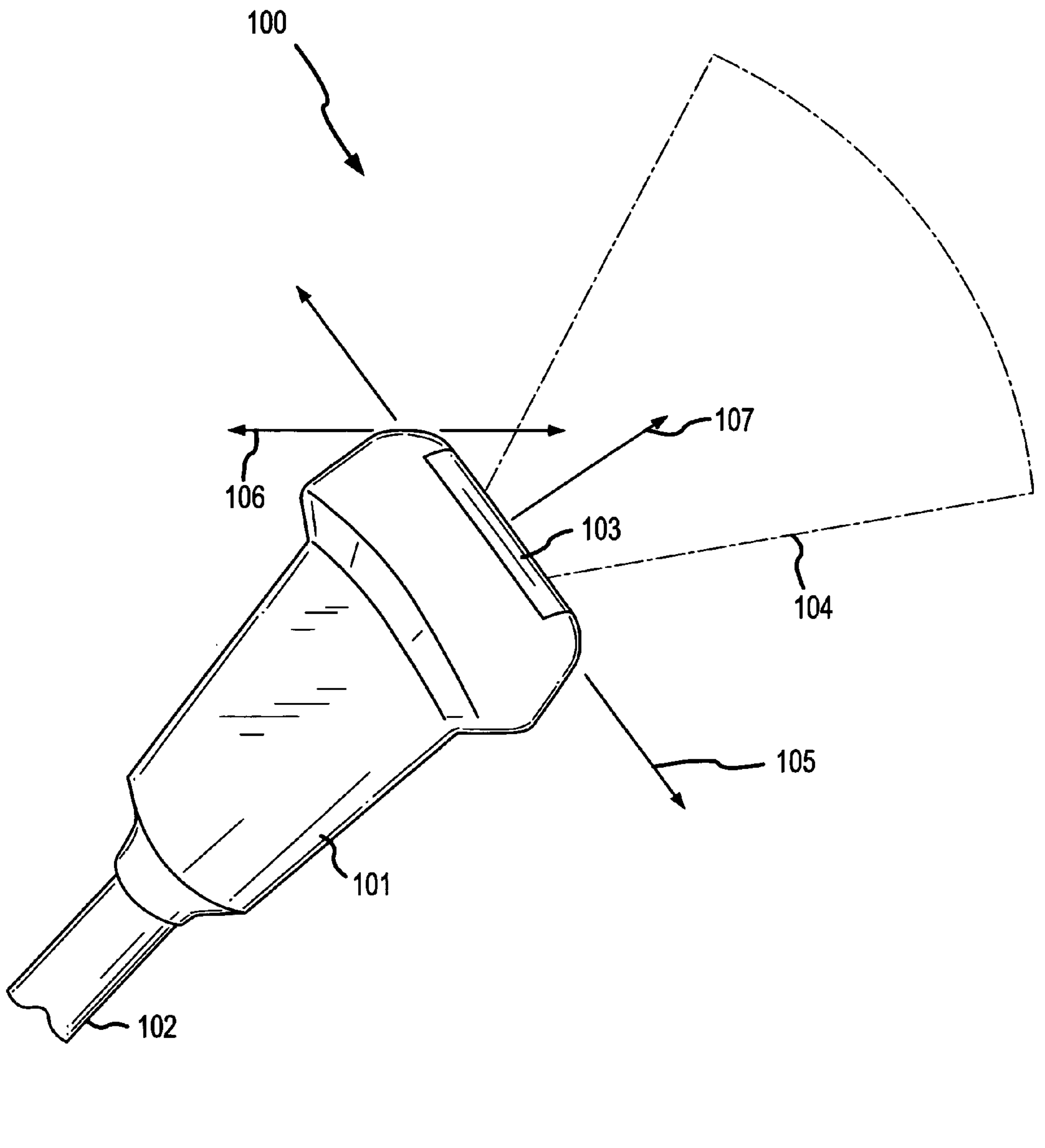
FIG. 1 illustrates an isometric view of an embodiment of an ultrasound probe assembly.

FIG. 1 illustrates a perspective view of an ultrasound transducer probe assembly 100. The probe assembly 100 includes a housing 101 and a cable 102. The cable 102 is interconnected to an ultrasound imaging apparatus (not shown). Generally, the probe assembly 100 includes a plurality of ultrasonic transducers contained within the housing 101 and operable to transmit ultrasonic energy through a probe assembly face 103 along one end of the probe assembly 101. The ultrasonic energy, in the form of acoustic waves, may be directed through the outer surface of a patient and into the internal structure of the patient. The acoustic waves may interact with and reflect off of various internal features. These reflections may then be detected by the probe assembly 100 and displayed as images of the internal structure of the patient by the ultrasound imaging apparatus.

Various parameters of the probe assembly 100 may differ from that shown in the probe assembly 100 of FIG. 1. As shown in FIG. 1, the probe assembly face 103 is substantially straight along a longitudinal axis 105. Alternatively, the probe assembly face 103 may be convexly curved along the longitudinal axis 105. As shown in FIG. 1, the probe assembly face 103 is curved slightly along an elevation axis 106. Alternatively, the probe assembly face 103 may be flat. The degree of curvature, discussed in detail below, of the probe assembly face 103 about and along the elevation axis 106 may be determined based on several factors including, for example, patient comfort and focusing requirements. Other variations of probe assembly 100 known to those skilled in the art may also be present. The present invention as described herein is intended to be operable with all such design variations.

In general, the images generated are of an area within an image plane 104, which extends outwardly from the probe assembly 100 along an axial or range axis 107. The image plane 104 is a two-dimensional plane within the plane defined by the axial axis 107 and longitudinal axis 105. The longitudinal axis 105 is also known to those skilled in the art as the lateral or azimuth axis. Commonly, imaging parameters within the image plane 104, for example focal length and depth of field, may be controlled through electronic means known to those skilled in the art. However, control of imaging parameters along the elevation axis 106, which is perpendicular to the image plane 104, is generally not accomplished electronically.

Figure 2:
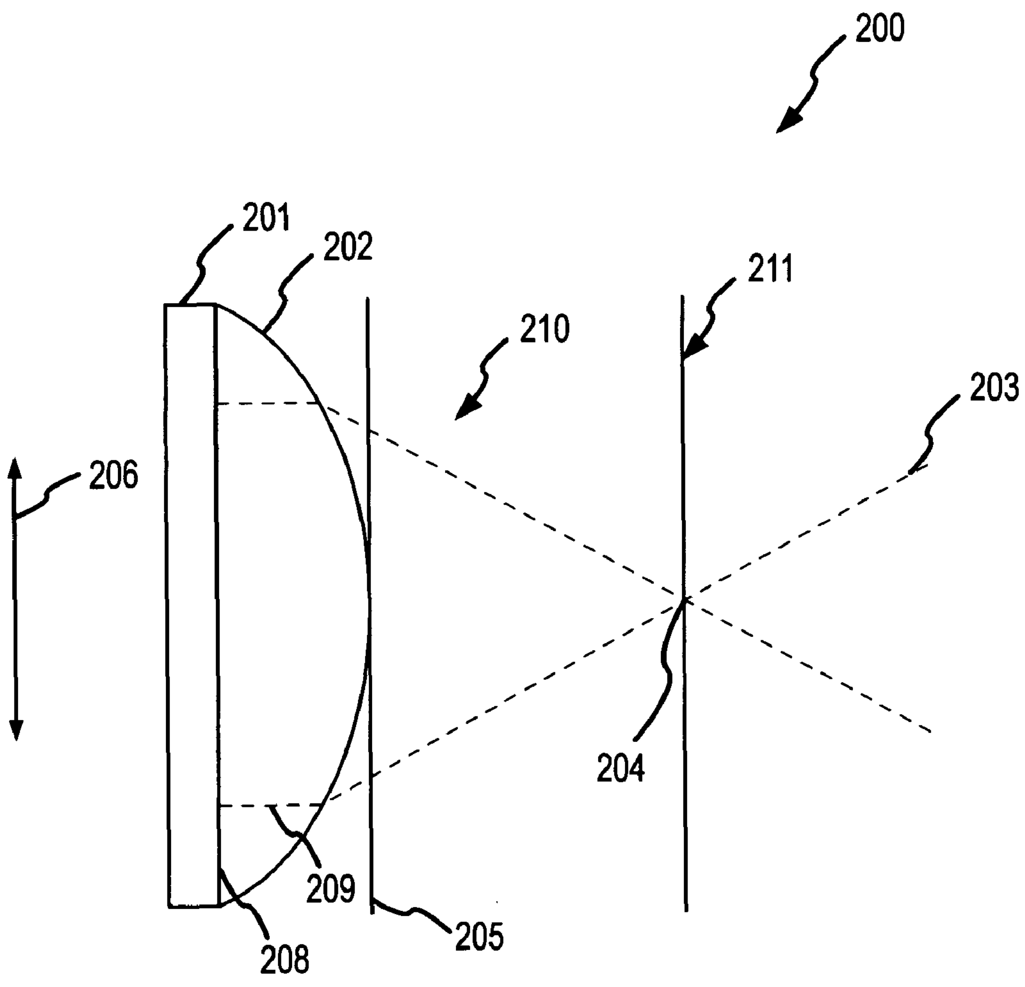
FIG.2 (PRIOR ART)
FIG. 2 schematically illustrates a cross sectional view of a prior art ultrasonic transducer system.

FIG. 2 is a schematic representation of an exemplary prior art ultrasonic transducer system 200 that includes a transducer 201 and an acoustic lens 202. FIG. 2 illustrates a slice, or cross sectional view, through a prior art probe assembly along an elevation axis 206 normal to a longitudinal axis. The transducer 201 is typically constructed of a layer of piezoelectric material. The transducer 201 may also include one or more matching layers. The piezoelectric and matching layers are represented schematically in FIG. 2 by the transducer 201.

As shown in FIG. 2, the acoustic lens 202 is generally constructed of a single lens element bonded to the transducer 201. The acoustic lens 202 is bonded to the acoustic face 208 of the transducer 201. The acoustic lens 202 of FIG. 2 is operable to focus acoustic waves generated at, and moving perpendicular to, the acoustic face 208 in the elevation axis 206. This focusing function is illustrated by a ray trace 203. An acoustic wave generated by the transducer 201 at the acoustic face 208 may travel in a path perpendicular to the acoustic face 208, through the acoustic lens, as illustrated by a first portion 209 of the ray trace 203. At the convex surface of the acoustic lens 202, the acoustic wave may be refracted as it passes from the acoustic lens 202 into the medium 210 immediately adjacent to the acoustic lens 202. The curvature of the acoustic lens 202 and the relative sound propagation velocities of the acoustic lens 202 and medium 210 determine the position of the focal point 204 of the acoustic lens 202.

The medium 210 is generally the body of a patient whose internal structure is being imaged. The sound propagation velocity through the human body is typically about that of water, which is about 1,500 meters per second (m/s). In the ultrasonic transducer system 200 of FIG. 2, for the acoustic lens 202 to focus the acoustic waves emanating from the acoustic face 208 as illustrated, the sound propagation velocity through the acoustic lens 202 must be lower than that of the medium 210. The ultrasonic transducer system 200 also includes an aperture plane 205. Aperture planes of transducer systems described herein are defined as planes parallel to an acoustic face and offset from the acoustic face by a distance equal to the maximum thickness of an acoustic lens or lens element attached to the acoustic face. Therefore in FIG. 2, the aperture plane 205 is illustrated as being parallel to the acoustic face 208 and offset from the acoustic face 208 by the maximum thickness of the acoustic lens 202, which for a convex lens, is located at the center of the transducer 201 along the elevation axis 206.

Figure 3A:
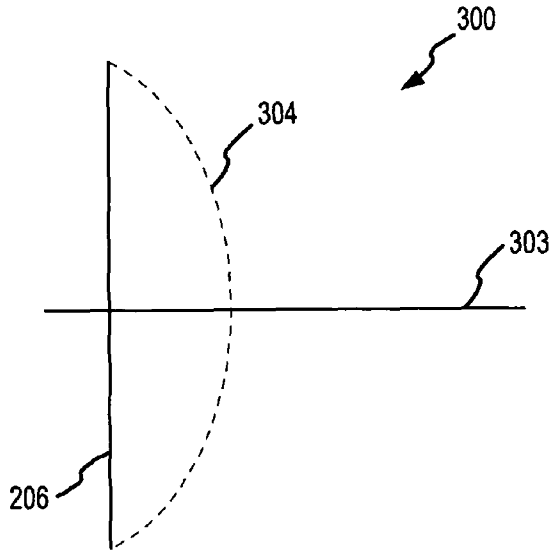
FIG.3A (PRIOR ART)
FIG. 3A graphically illustrates loss through an aperture plane for the prior art ultrasonic transducer system of FIG. 2 as a function of position along an elevation axis.

FIG. 3A is an illustration of one aspect of the performance of the prior art lens illustrated in FIG. 2. FIG. 3A is a graph 300 of the distribution of loss through the acoustic lens 202 of FIG. 2 as a function of position along the elevation axis 206. A positive value along the axis 303 represents loss through the acoustic lens 202. In a single-element acoustic lens constructed of a uniform material, acoustic loss will be a function of the amount of material that the acoustic wave must pass through. Therefore, as illustrated in FIG. 3A, the shape of the curve representing acoustic loss 304 as a function of elevation is similar to the shape of the acoustic lens 202. The maximum loss occurs along the axis 303, which corresponds to the point along the elevation axis 206 where the acoustic lens 202 is at its maximum thickness. The minimum loss occurs at the periphery of the acoustic lens 202, where the material thickness is at a minimum.

Figure 3B:
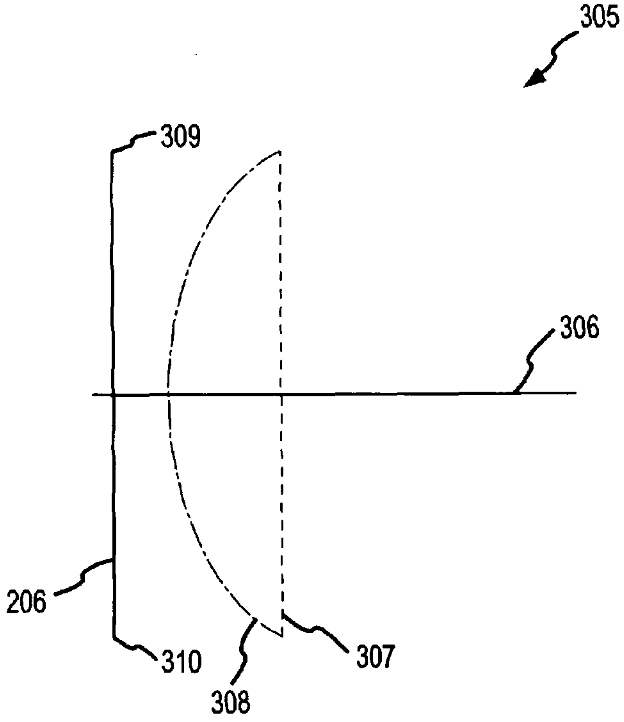
FIG.3B (PRIOR ART)
FIG. 3B graphically illustrates an amplitude profile at the aperture plane of the prior art ultrasonic transducer system of FIG. 2 as a function of position along the elevation axis.

FIG. 3B is an illustration of the effects of the distribution of loss shown in FIG. 3A. FIG. 3B is a graph 305 of the distribution of the amplitudes of an acoustic wave generated by the transducer 201 of FIG. 2. Again, the vertical axis is the elevation axis 206. The axis 306 represents the amplitude of the acoustic wave as a function of position along the elevation axis 206. Acoustic face amplitude distribution 307 represents the distribution of the amplitude as generated at the acoustic face 208. As shown, the acoustic face amplitude distribution 307 is generally uniform across the acoustic face 208. Amplitude distribution 308 represents the distribution of the amplitude in the aperture plane 205. As will be appreciated, the shape of the amplitude distribution 308 is concave with a minimum value along the axis 306, which corresponds to the point along the elevation axis 206 where the acoustic lens 202 is at its maximum thickness. In other words, the portion of the acoustic wave generated at the acoustic face 208 that must pass through the maximum amount of material of the acoustic lens 202 experiences a relative maximum of acoustic loss resulting in a lower amplitude along the axis 306 of the graph 305. The portions of the acoustic wave along the upper and lower edges of the acoustic face 208 must pass through less material, and therefore experience less loss. This is shown in FIG. 3B by the relatively larger amplitudes along the amplitude distribution 308 at the extremes 309, 310 of the elevation axis 206.

Figure 4:
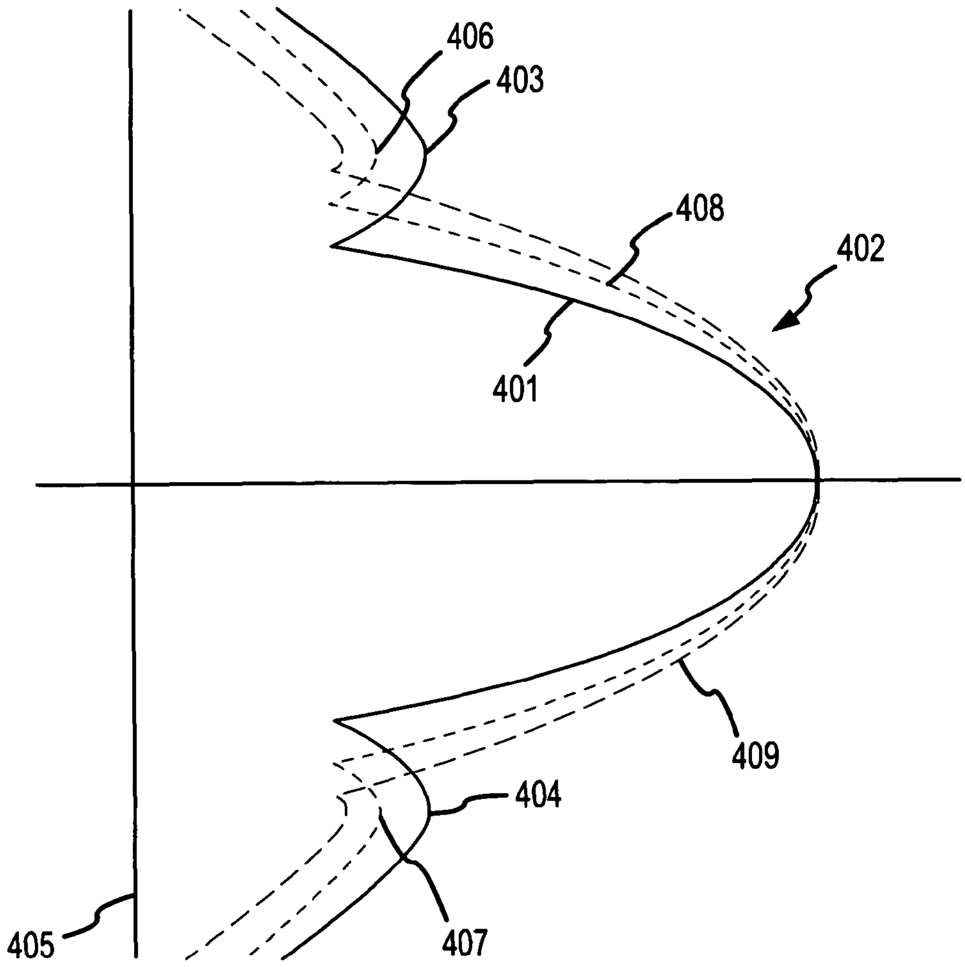
FIG. 4 graphically illustrates three different amplitude profiles at a focal plane.

The amplitude distribution 308 at the aperture plane 205 (shown in FIG. 2) may have negative effects on the focusing performance of the ultrasonic transducer system 200 of FIG. 2 along the elevation axis 206 at a focal plane 211. A focal plane is a plane parallel to an aperture plane that intersects the focal point of a lens. FIG. 4 is an illustration that includes a typical amplitude distribution 401 that may occur at the focal plane 211 of the ultrasonic transducer system 200 of FIG. 2. Generally, an amplitude distribution 308 where amplitude maxima are located at the extremes 309, 310 of the elevation axis 206 may result in amplitude distribution 401 at the focal plane 211 that includes significant (in comparison to the main portion 402 of the amplitude distribution 401) primary side lobes 403, 404. Such side lobes 403, 404 are generally undesirable since, for example, their presence may contribute to artifacts in the final ultrasonic image due to reflections from objects outside of the image plane. Also, in general, it is desirable to have a narrow amplitude distribution along the elevation axis 405 to improve image sharpness.

To reduce the size of the primary side lobes 403, 404 relative to the main portion 402 of the amplitude distribution 401, it may be desirable to apodize the acoustic wave generated by an ultrasonic transducer. For example, apodization of the waveform produced by the ultrasonic transducer system 200 of FIG. 2 may result in a reduction of the primary side lobes 403, 404 of the aforementioned amplitude distribution 401. Apodization of the amplitude distribution may result in smaller primary side lobes 406, 407, illustrated along amplitude distribution 408. Amplitude distribution 408, relative to amplitude distribution 401, may produce fewer final image artifacts and better focusing. These improvements in waveform may result in improved contrast resolution of an ultrasound imaging system. This improved contrast resolution of the ultrasound imaging system may be most beneficial in a region between about 70% and about 130% of the focal length of the elevation axis.

Figure 5:
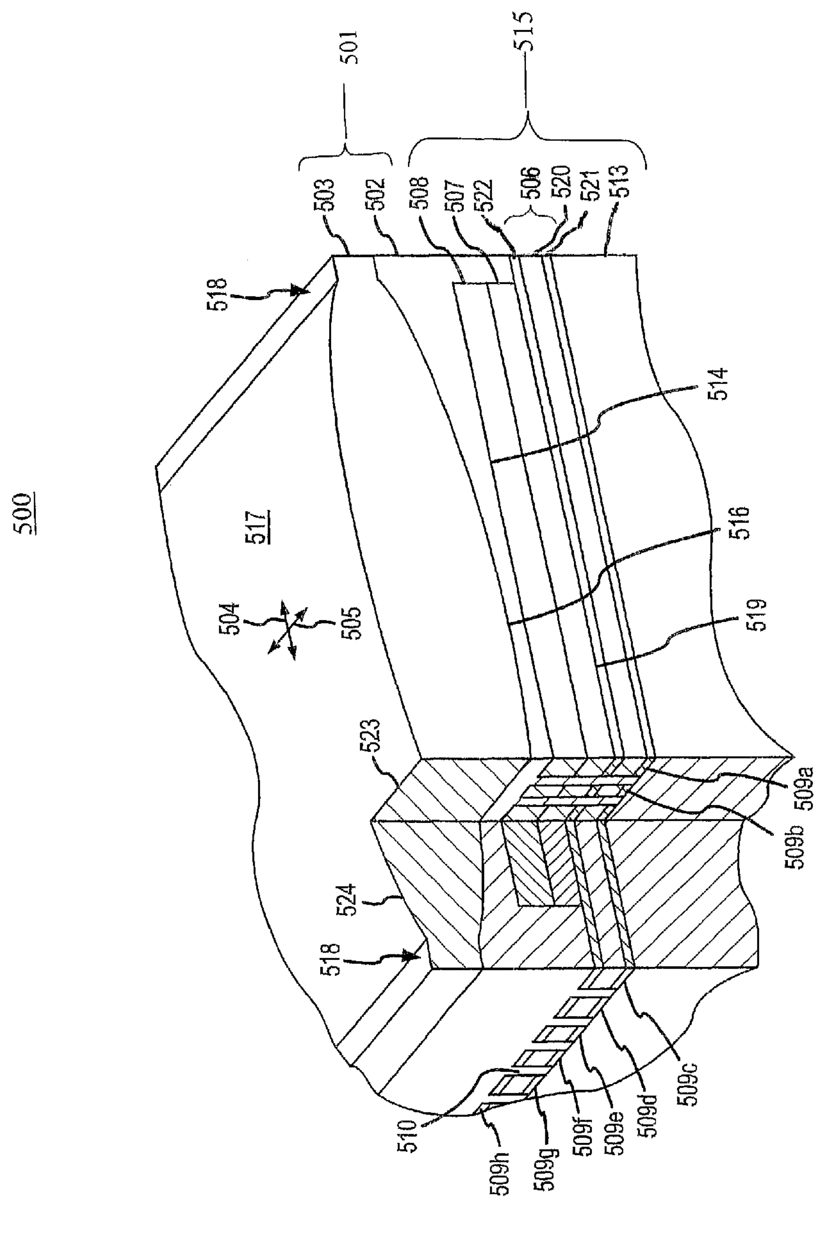
FIG. 5 illustrates an isometric view of an ultrasonic transducer system with two lens elements.

Turning to FIG. 5, an embodiment of the present invention will now be described. FIG. 5 is a cross-sectional schematic view of an ultrasonic transducer system 500 that includes an acoustic lens 501 that is comprised of a first lens element 502 and a second lens element 503. A section along lines 523, 524 has been cutaway in FIG. 5 to reveal internal details of the ultrasonic transducer system 500. The ultrasound transducer system 500 has a longitudinal axis 505 and an elevation axis 504, which, for example, are similar to the longitudinal axis 105 and elevation axis 106, respectively, of the probe assembly of FIG. 1. The front surface 517 of the second lens element 503 may be the outer surface of an ultrasound probe assembly, such as, for example, the probe assembly face 103 as shown in FIG. 1.

Generally, as is known to those skilled in the art, a transducer 515 (comprising of a piezoelectric layer 506 and any optional matching layer attached thereto described below) may be divided into discrete sections (for example, sections 509*a* through 509*h*) along the longitudinal axis 505. Each of these discrete sections is a transducer element (e.g., transducer element 509*a*). A backing 513 may also be present. Although a plurality of transducer elements are illustrated in FIG. 5, the ultrasonic transducer system 500, in an alternate embodiment, may contain a single transducer element. Although FIG. 5 shows the ultrasonic transducer system 500 as being straight along the longitudinal axis 505, in an alternative embodiment, the ultrasonic transducer system 500 may be curved along the longitudinal axis 505. This curvature may, for example, be achieved by placing individual planar transducer elements at angles to each other along the longitudinal axis 505.

The transducer 515 may include a piezoelectric layer 506. The piezoelectric layer 506 may include a layer of piezoelectric material 520, a first electrode layer 521 and a second electrode layer 522. The layer of piezoelectric material 520 may be comprised of a ceramic-based material (e.g., lead zirconate titanite (PZT)). The first electrode layer 521 may be comprised of one or more layers of conductive material. Similarly, the second electrode layer 522 may be comprised of one or more layers of conductive material. The portion of the first electrode layer 521 connected to each individual transducer element, such as element 509*a*, may serve as the signal electrode for that individual transducer element. Similarly, the portion of the second electrode layer 522 connected to each individual transducer element, such as element 509*a*, may serve as the ground electrode for that individual transducer element.

Generally, the signal electrodes and ground electrodes are arranged as illustrated in FIG. 5 with the ground electrode on the side of the piezoelectric material 520 that faces the region to be imaged. However, the position of the signal and ground electrodes may be reversed. In such embodiments, it may be necessary to provide an additional grounding layer to shield the signal layer. Such an additional grounding layer may, for example, be positioned within a lens attached to the transducer. A variety of methods known to those skilled in the art may be utilized to electrically interconnect with the ground and signal electrodes. The ground electrodes may be individual electrodes as illustrated in FIG. 5 or may be one continuous layer of grounding material situated over each of the individual transducer elements. The individual transducer element electrodes may be interconnected to electronic circuitry, which may provide for acoustic wave generation and sensing.

Optional acoustic matching layers may be interconnected to the piezoelectric layer 506. The ultrasound transducer system 500 of FIG. 5 shows a first optional matching layer 507 and a second optional matching layer 508 interconnected to the piezoelectric layer 506. The presence and number of optional matching layers may vary from the configuration illustrated in FIG. 5. The transducer 515 comprises the piezoelectric layer 506, along with any optional matching layers attached thereto.

The piezoelectric layer 506 may be a mechanically active layer operable to convert electrical energy to mechanical energy and mechanical energy into electrical energy. As previously described, the piezoelectric layer 506 may be comprised of a layer of PZT material sandwiched between ground and signal electrodes. However, a variety of components and materials able to generate acoustic signals may be substituted for at least a portion of the piezoelectric layer 506. Such components and materials include ceramic materials, ferroelectric materials, composite materials, capacitor micromachined ultrasound transducers (CMUTs), piezoelectric micromachined ultrasound transducers (PMUTs), and any combination thereof. Regardless of the specific components, electromechanical principle of operation or materials, the mechanically active layer may comprise a means of converting electrical energy to mechanical energy and mechanical energy into electrical energy, which has an acoustic face 514 (described below with respect to piezoelectrics), and a plurality of transducer elements that may be controlled individually. Generally, any system known to those skilled in the art for generating ultrasonic acoustic signals that may be used for imaging purposes may be utilized in the mechanically active layer.

Returning to the embodiment illustrated in FIG. 5, the piezoelectric layer 506 is illustrated as arranged in a one-dimensional array with the transducer elements arranged along the longitudinal axis 505. In alternate embodiments, the transducer elements may be arranged in other configurations such as multirow arrays and two-dimensional arrays. Multirow arrays divide the transducer into multiple transducers, electronically controlled, along the elevation axis. Such configurations may have some electronic control in elevation. Nonetheless, the benefits of the acoustic lenses and systems described herein may also be realized in systems comprising multirow arrays. A two-dimensional array is divided into small enough elements in both directions (longitude and elevation) in the aperture plane that the array may be steered in any direction. While all the elements may be electrically controlled and may be apodized electronically in both directions, a lens with a convex outer surface may still be used to provide an ergonomic interface with tissue. Such a configuration may benefit from a lens that may have similar apodization properties to those of the lenses described herein.

Returning again to the embodiment illustrated in FIG. 5, the back surface of a first lens element 502 of the ultrasonic transducer system 500 may be acoustically coupled to the acoustic face 514 of the transducer 515. In general, the acoustic face 514 is the front surface of the transducer 515. In embodiments where the transducer 515 includes optional matching layers, as in the embodiment illustrated in FIG. 5, the acoustic face is the outermost face of the outermost optional acoustic matching layer (e.g., surface 514 in FIG. 5). In embodiments where the transducer 515 does not include optional matching layers, the acoustic face may be the front surface 519 of the piezoelectric layer 506. Since piezoelectric layer 506 may include an electrode along its front surface 519, the first lens element 502 may be in contact with the second electrode layer 522.

The acoustic lens 501 may be interconnected to the transducer 515 in any suitable method. One such method is to cast the first lens element 502 directly onto the transducer 515. This process may be accomplished one unit at a time using individual molds. Alternatively, several first lens elements 502 may be cast simultaneously onto several transducers 515 in a mass casting process. The lenses may be created in individual cavities or in a continuous cavity. If produced in a continuous cavity, the continuous first lens element may then be separated into individual first lens elements 502. A second lens element 503 may then be cast onto the first lens element 502 in a similar fashion to produce the acoustic lens illustrated in FIG. 5.

In an alternate production method, the first lens element 502 may be cast as a separate piece, either individually or in a mass molding operation. The second lens element 503 may then be cast onto the first lens element 502 to produce the acoustic lens 501. The order of which lens element is cast first may be reversed. The acoustic lens 501 may then be attached to the transducer 515. This attachment may use a bonding agent such as glue to secure the acoustic lens 501 to the acoustic face 514 of the transducer 515. It may be preferable to use a thin layer of bonding agent with a low viscosity. It may be preferable that the layer of bonding material not be acoustically significant. It may be preferable that no air gap or air bubbles exist between either the acoustic lens 501 and the transducer 515 or between the first lens element 502 and the second lens element 503. The acoustic lens 501 may be operable to be used to replace existing lenses on transducer systems already in operation (e.g., in a retrofit application). In such an application, the acoustic lens 501 may be provided as a separate apparatus that may be attached to an existing transducer. Such an acoustic lens 501 may include a layer of bonding agent to facilitate attachment to a transducer.

Returning to FIG. 5, each individual transducer element may be separated from neighboring elements by kerfs (e.g., kerf 510 between transducer elements 509*f* and 509*g*) produced during the dicing of the transducer 515. In embodiments where the first lens element 502 is cast directly onto the transducer 515, the kerf may be filled with the material of the first lens element 502 during casting. Alternatively, the kerfs may be filled in a separate step prior to attachment of the first lens element 502 to the transducer 515.

The back surface of the second lens element 503 may be acoustically coupled to the first lens element 502 along a first lens element front surface 516. The second lens element 503 includes the second lens element front surface 517.

A region 518, which may include edge portions of the first lens element 502 and the second lens element 503, outside of the plane of the acoustic face 514 may be present. As illustrated, the lens elements 502, 503 may be of a uniform thickness in the region 518. The inclusion of the region 518, particularly in the second lens element 503, avoids having vertical (relative to the acoustic face 514) surfaces and/or sharp corners above the plane defined by the acoustic face 514, which may produce image artifacts or image degradation.

Figure 6:
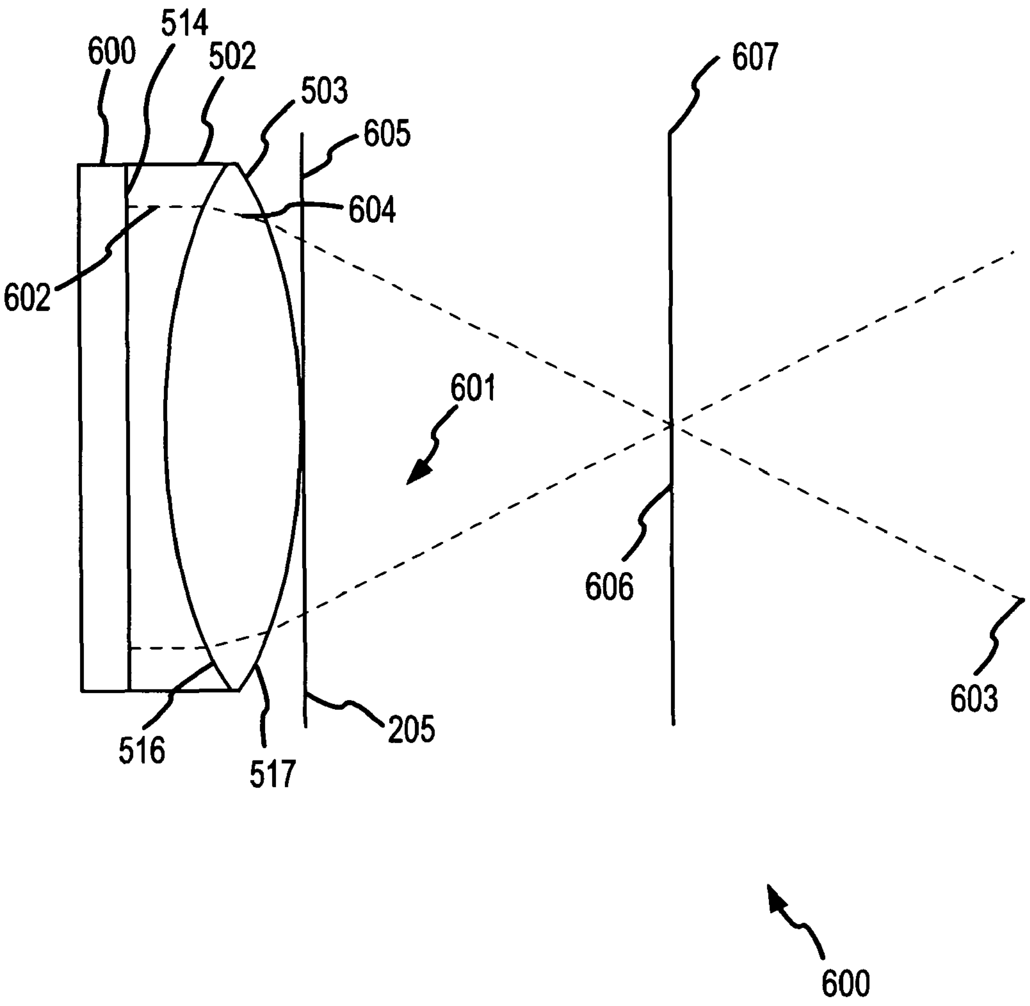
FIG. 6 schematically illustrates a cross sectional view of the ultrasonic transducer system of FIG. 5.

The performance of the ultrasound transducer system 500 will now be discussed with reference to FIG. 6. FIG. 6 illustrates a slice, or cross sectional view, through ultrasound transducer system 500 of FIG. 5 along the elevation axis 504 normal to a longitudinal axis 505. In FIG. 6, the piezoelectric layer 506 and any optional matching layers are represented by the transducer 600. The transducer 600 may be operable to produce a uniform acoustic wave emanating from the acoustic face 514. An acoustic wave emanating from the acoustic face 514 may pass through the first lens element 502, the second lens element 503, and into a medium 601 external to the second lens element 503. Typically the medium 601 will be the area of a patient to be imaged.

The focusing of the acoustic wave produced by the transducer 600 may occur in two stages. The first stage may occur at the interface between the first lens element 502 and second lens element 503. The acoustic wave generated at the acoustic face 514 may propagate through the first lens element 502 perpendicular to the acoustic face 514 as illustrated by the section 602 of ray trace 603 that is within the first lens element 502. Upon passing through the interface between the first lens element 502 and the second lens element 503, the acoustic wave may be refracted at each lens surface to a first focal length as represented by the change in direction of the section 604 of the ray trace 603 relative to the section 602 within the first lens element 502. This refraction to a first focal length may occur if the sound propagation velocity through the first lens element 502 is faster than the sound propagation velocity through the second lens element 503. In an embodiment, the front surface 516 of the first lens element 502 has a radius of curvature between about 2 mm and 200 mm. In another embodiment, the front surface 516 has a radius of curvature of about 100 mm.

Further refraction of the acoustic wave may occur as the acoustic wave passes through the second lens element front surface 517. In the ultrasonic transducer system 500, for the acoustic wave to be further refracted toward the focal point as it passes through the second lens element front surface 517 as illustrated, the sound propagation velocity through the second lens element 503 must be lower than that of the medium 601. Since the medium 601 is typically the human body, the sound propagation velocity through the second lens element 503 may be lower than about 1,500 m/s to provide desired refraction at the second lens element front surface 517. Although a wide range of focal lengths of the ultrasonic transducer system 500 may be achieved, medical ultrasonic transducers typically have a focal length of between about 10 mm and 150 mm. The ultrasonic transducer system 500 also includes an aperture plane 605, a focal point 606, and a focal plane 607. In an embodiment, the front surface 517 may be flat. In another embodiment, the front surface 517 of the second lens element 503 has a radius of curvature of at least about 20 mm. In still another embodiment, the front surface 517 has a radius of curvature of about 49 mm.

In an embodiment, the sound propagation velocity of the second lens element 503 is lower than about 1,500 m/s. In another embodiment, the sound propagation velocity of the second lens element 503 is lower than about 1,250 m/s. In yet another embodiment, the sound propagation velocity of the second lens element 503 is about 1,000 m/s and the sound propagation velocity of the first lens element 502 is about 1,680 m/s. A preferable range of sound propagation velocities for materials used in the lens elements is between 600 and 2,500 m/s.

As an acoustic wave passes through the first lens element 502 and the second lens element 503, some losses will occur. By carefully controlling the loss through a unit thickness of the material used for the first and second lens elements 502, 503, various loss profiles can be achieved. For example, if a material with relatively high a loss rate is used to construct the first lens element 502 and a material with a relatively low loss rate is used to construct the second lens element 503, the majority of loss may occur within the first lens element 502. As shown in FIGS. 5 and 6, the first lens element front surface 516 may be concave. As a result, more acoustic loss may occur along the edges of the acoustic face 514 as compared to the center of the acoustic face 514. This relatively larger loss along the edges may result in apodization of the acoustic wave. Conversely, if the second lens element 503 is constructed of a material with a high loss rate relative to that of the first lens element 502, the effect will be a reverse apodization of the acoustic wave similar to that of the prior art system illustrated by amplitude distribution 308 in FIG. 3B.

It will be appreciated that by varying the relative acoustic loss per unit thickness of the materials used to construct the first lens element 502 and the second lens element 503, a variety of acoustic loss distributions may be achieved. This is illustrated in FIG. 7A. In FIG. 7A, the vertical axis 701 corresponds to the elevation axis of the transducer. The axis 708 of FIG. 7A represents the acoustic loss through the acoustic lens 501 as a function of elevation. As previously discussed, through lens element material control, a uniform loss 702 (or uniform attenuation) along the elevation axis 701 may be achieved. In such a configuration, if the loss rate of the material of the first lens element 502 is increased relative to the loss rate of the material of the second lens element 503, a loss profile 703 where the acoustic loss is greater along the edges of the profile relative to the center of the profile may be achieved. The loss profile 703 may be quantified in terms of an edge-to-center apodization ratio. This edge-to-center apodization ratio may be defined as the amount of loss at an edge 704 of the aperture divided by the amount of loss at the center of the aperture 705. In an embodiment, the edge-to-center apodization ratio may be at least 1:1. In an embodiment, the edge-to-center apodization ratio may be at least 3 dB.

Figure 7B:
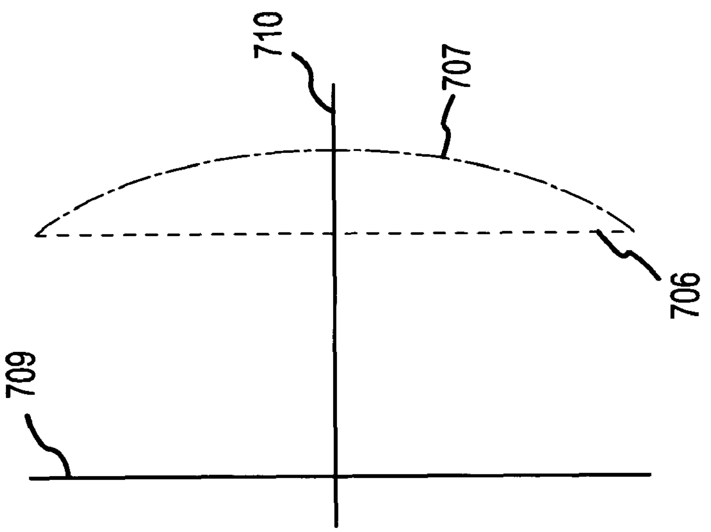
FIG. 7B graphically illustrates an amplitude profile at the aperture plane for the ultrasonic transducer system of FIG. 5 as a function of position along the elevation axis.
Figure 7A:
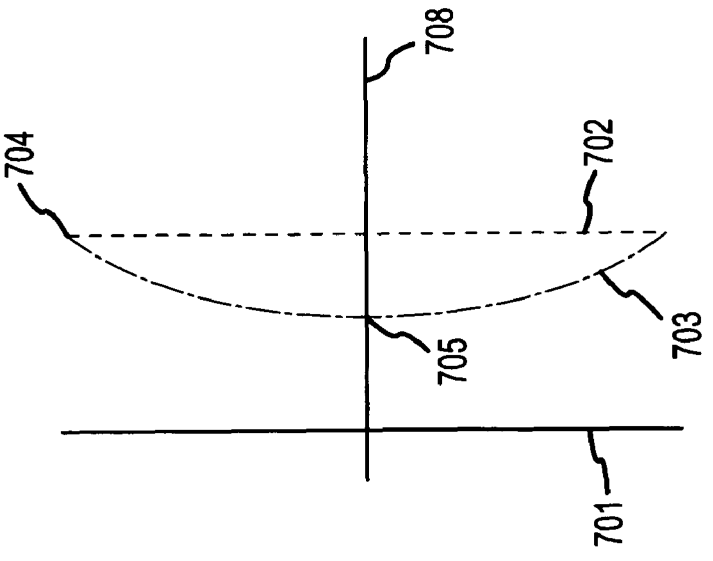
FIG. 7A graphically illustrates loss through an aperture plane for the ultrasonic transducer system of FIG. 5 as a function of position along an elevation axis.

In FIG. 7B, the vertical axis 709 corresponds to the elevation axis 206 of the transducer. The axis 710 represents amplitude of an acoustic wave. The loss profiles 702 and 703 illustrated in FIG. 7A may result in the amplitude distributions 706 and 707 respectively as illustrated in FIG. 7B. That is, the uniform loss profile 702 may result in a uniform amplitude distribution 706 at the aperture plane 605. Such a uniform loss may result in an acoustic wave having an amplitude distribution that does not vary by more than 10% across the aperture plane 605. Similarly, the apodizing loss profile 703 may result in an apodized amplitude distribution 707 at the aperture plane 605.

The ratio of acoustic loss per unit thickness of material of the first lens element 502 to the second lens element 503 may be varied. In an embodiment, the ratio may be at least two to one. In another embodiment the ratio may be at least three to one. In an embodiment, the first lens element 502 material has an acoustic loss per unit thickness of at least about 0.2 dB/cm at 1 MHz. In another embodiment the first lens element 502 material has an acoustic loss per unit thickness of at least about 4 dB/cm at 1 MHz. In another embodiment the first lens element 502 material has an acoustic loss per unit thickness of at least about 9 dB/cm at 1 MHz. In one particular embodiment the first lens element 502 material has a loss per unit thickness of about 9 dB/cm at 1 MHz and the second lens element 503 material has a loss per unit thickness of about 2.7 dB/cm at 1 MHz. Generally, the acoustic loss per unit thicknesses described herein may vary linearly with frequency. However, some lens materials that may be used may not have a linear frequency dependency.

Several choices exist for the materials to be used in the construction of the first lens element 502 and the second lens element 503. The first lens element 502 may be composed of a different material or different materials than that of the second lens element 503. The first lens element 502 and second lens element 503 may be composed of the same materials, in which case the relative percentage by weight of a particular material contained within the first lens element 502 may be different than the relative percentage by weight of that material within the second lens element 503.

For example, the first lens element 502 may be comprised of a polymer-based material. The polymer-based material may include polyurethane, epoxy material, silicone, or any combination thereof. Likewise, the second lens element 503 may be comprised of a polymer-based material. The polymer-based material may include polyurethane, epoxy material, silicone, or any combination thereof. The epoxy material may be formed from epoxy resins, for example, through curing methods or reactive processes known to those skilled in the art. In an embodiment, the first lens element 502 may be comprised of polyurethane and the second lens element 503 may be comprised of silicone. In such an embodiment, in order to bond the second lens element 503 to the first lens element 502, the first lens element front surface 516 may be treated with chemical primers during the lens manufacturing process. Such a treatment may enable the silicone of the second lens element 503 to adequately bond with the polyurethane of the first lens element 502. The aforementioned silicone may be in the form of silicone rubber. In one particular example, the first lens element 502 may be composed of substantially 100% polyurethane and the second lens element 503 may be composed of substantially 100% silicone rubber.

To modify the acoustic loss per unit thickness of material as discussed above, the materials used in construction of the lens elements may be loaded. In this regard, foreign particles may be introduced into the lens materials prior to being cured. These particles may be used to increase or decrease the loss per unit thickness of the material. For example, in an embodiment, tungsten particles may be added to the polyurethane used to construct the first lens element 502. These particles may serve to increase the loss per unit thickness of the first lens element 502. For example, adding 100% percent by weight of tungsten to polyurethane used to construct the first lens element 502 may increase the loss per unit thickness of the first lens element 502 from about 9 dB/cm at 1 MHz to about 30 dB/cm at 1 MHz.

Added particles may serve to increase or decrease the acoustic impedance of a material used in construction of a lens element to improve acoustic impedance matching and reduce reflections from the lens surfaces. Lighter weight particles, such as glass microballoons, can be added to a material to lower its average density and hence its acoustic impedance. Heavier materials, such as tungsten, increase the density and acoustic impedance. Typically the addition of particles increases attenuation. It may be beneficial to adjust both the loss and the impedance in the lens layers described herein to achieve a desired apodization.

As may be appreciated, in the above-discussed embodiments each lens element and lens surface may serve at least one specific function. Therefore, it may be preferred that the entirety of the acoustic wave produced by the transducer 600 pass through both the first lens element 502 and the second lens element 503. Accordingly, the first lens element 502 and the second lens element 503 may both cover the entirety of the acoustic face 514.

The above described two-element ultrasonic transducer system 500 may be operable to produce an amplitude distribution at the focal plane 607 that is apodized relative to a amplitude distribution at a focal plane produced by a single element lens (such as the lens of FIG. 2). The apodized amplitude distribution may result in improved image focusing and reduced image artifacts. This apodization may be achieved, for example, by uniformly attenuating an acoustic wave, as illustrated by the uniform loss distribution 702 of FIG. 7A, or by apodizing an acoustic wave as illustrated by the apodizing loss distribution 703. By way of examples, the amplitude distribution 401 of FIG. 4 may represent the amplitude distribution at the focal plane 211 of the prior art ultrasonic transducer system 200 of FIG. 2, the amplitude distribution 408 may represent the amplitude distribution of a uniformly attenuated acoustic signal generated by the ultrasonic transducer system 500, and finally the amplitude distribution 409 may represent the amplitude distribution of an apodized acoustic signal generated by the ultrasonic transducer system 500. It will be appreciated that by varying the above-discussed parameters, varying degrees of apodization at a focal plane may be achieved.

The loss profile 703 and corresponding amplitude distribution 707 illustrated in FIGS. 7A and 7B, respectfully, show smooth and symmetric curvatures with constant radii of curvature. However, variations from such a configuration are within the scope of the present invention. For example, it may be desired that the imaging plane not be perpendicular to the acoustic face 514, but that it be at a slight angle from perpendicular. In such a situation, the second lens element 503 may be tilted relative to the acoustic face 514. The first lens element 502 may remain operable to produce apodization, although the apodization may not be symmetrical. In a similar fashion, the entire second lens element 503 may be translated relative to the acoustic face 514 (for example, the second lens element may be translated downward from the position illustrated in FIG. 6) in order to shift the focal point 606 from along the center of the acoustic face 514. Again, the first lens element 502 may remain operable to produce apodization, although the apodization may not be symmetrical.

Aspheric lens surfaces may be used to independently adjust the apodization curve and the effective focus. If a stronger apodization is desired along the edges of the aperture plane 605, the radius of curvature of interface between the first lens element 502 and second lens element 503 may be reduced toward the edges of the acoustic face 514, thereby increasing the thickness of the first lens element 502 near the edges of the acoustic face 514. The resulting change in focusing characteristics of the transducer system may be acceptable.

It is also noted that the above description illustrates a system with two-stage focusing with a first stage occurring at the interface between the first lens element 502 and the second lens element 503 and the second stage occurring at the second lens element front surface 517. In another embodiment, the sound propagation velocities of the first lens element 502 and the second lens element 503 may be substantially equal. In such an embodiment, no focusing may occur as the acoustic wave passes through the interface between the first lens element 502 and the second lens element 503. Accordingly, all the focusing of the ultrasound transducer system 500 would occur as the acoustic wave passes through the second lens element front surface 517. In such a configuration, apodization would in large part occur as the acoustic wave passes through the first lens element 502 and focusing would occur as the acoustic wave passes through the second lens element front surface 517. Additionally, in such a configuration, the interface between the first lens element 502 and the second lens element 503 may not be uniform with a constant radius of curvature as is typical of focusing surfaces. Since no refraction may occur at the interface, other shapes, such as non-constant radii of curvature, asymmetrical curvature, stepped sections or non-continuous sections may be utilized. In this regard, a wide variety of loss profiles and accompanying amplitude distributions may be achieved.

It is further noted that the focusing may take place entirely at the interface between the first lens element 502 and the second lens element 503. In such a configuration, the second lens element front surface 517 may be flat. Alternatively, the second lens element front surface 517 may be curved but the sound propagation velocity of the material used in construction of the second lens element 503 may match the sound propagation velocity of human tissue so that substantially no refraction may occur as the acoustic wave passes through the second lens element front surface 517.

Figure 8:
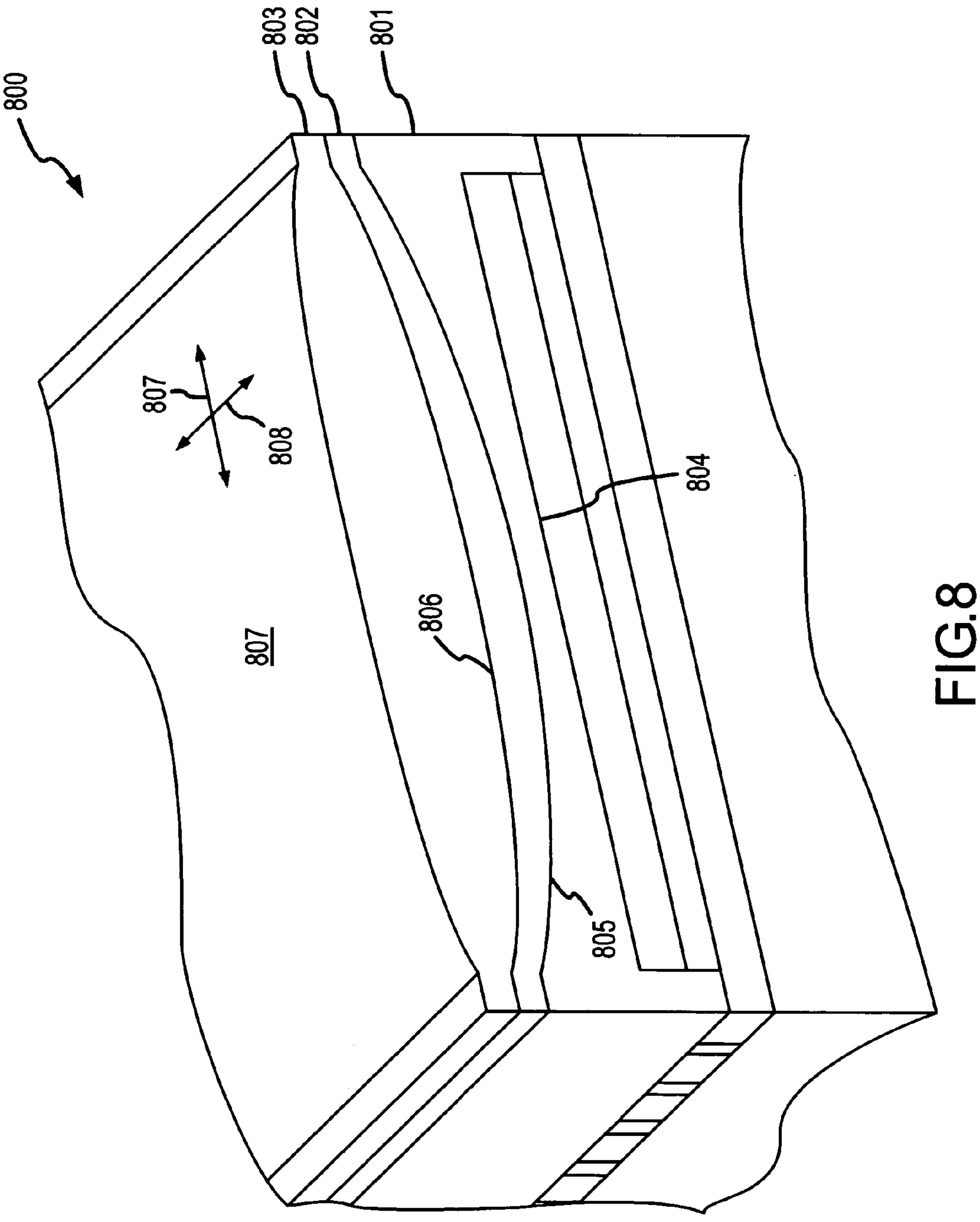
FIG. 8 illustrates an isometric view of an ultrasonic transducer system including three lens elements.

FIG. 8 illustrates an ultrasonic transducer system 800 that includes three lens elements: a first lens element 801, a second lens element 802, and a third lens element 803. To avoid repetition, generally only those features unique to the three-layer ultrasonic transducer system 800 relative to the two-layer ultrasonic transducer system 500 will be discussed. As illustrated in FIG. 8, the back surface of a first lens element 801 is acoustically coupled to an acoustic face 804. As illustrated, the front surface 805 of the first lens element 801 may be concave. A back surface of the second lens element 802 may be acoustically coupled to the first lens element 801 along the front surface 805 of the first lens element 801. As illustrated, a front surface 806 of the second lens element 802 may also be concave. A back surface of the third lens element 803 may be acoustically coupled to the second lens element 802 along the front surface 806 of the second lens element 802. As illustrated, a front surface 807 of the third lens element 803 may be convex. Alternatively, the front surface 807 may be flat. Although a plurality of transducer elements are illustrated in FIG. 8, the ultrasonic transducer system 800, in an alternate embodiment, may contain a single transducer element. Although FIG. 8 shows the ultrasonic transducer system 800 as being straight along a longitudinal axis 808, in an alternative embodiment, the ultrasonic transducer system 800 may be curved along the longitudinal axis 808.

Several choices exist for the materials to be used in the construction of the first lens element 801, the second lens element 802, and the third lens element 803. Any one of the three lens elements may be composed of a different material or different materials than one of or both of the other lens elements. Any two, or all three, of the three lens elements may be composed of the same materials. In embodiments where a pair or all three of the lens elements are composed of the same materials, the relative percentage by weight of a particular material contained within one of the lens elements may be different than the relative percentage by weight of that material within another of the lens elements composed of the same materials.

For example, the first lens element 801 may be comprised of a polymer-based material. Likewise, the second lens element 802 may be comprised of a polymer-based material. Similarly, the third lens element 803 may be comprised of a polymer-based material.

In an embodiment, the first lens element 801 may be comprised of polyurethane, the second lens element 802 may be comprised of polyurethane and the third lens element 803 may be comprised of silicone. In one particular example, the first lens element 801 may be composed of tungsten powder suspended in a matrix of substantially 100% polyurethane, the second lens element 802 may be composed of substantially 100% polyurethane, and the third lens element 803 may be composed of substantially 100% silicone rubber.

Figure 9:
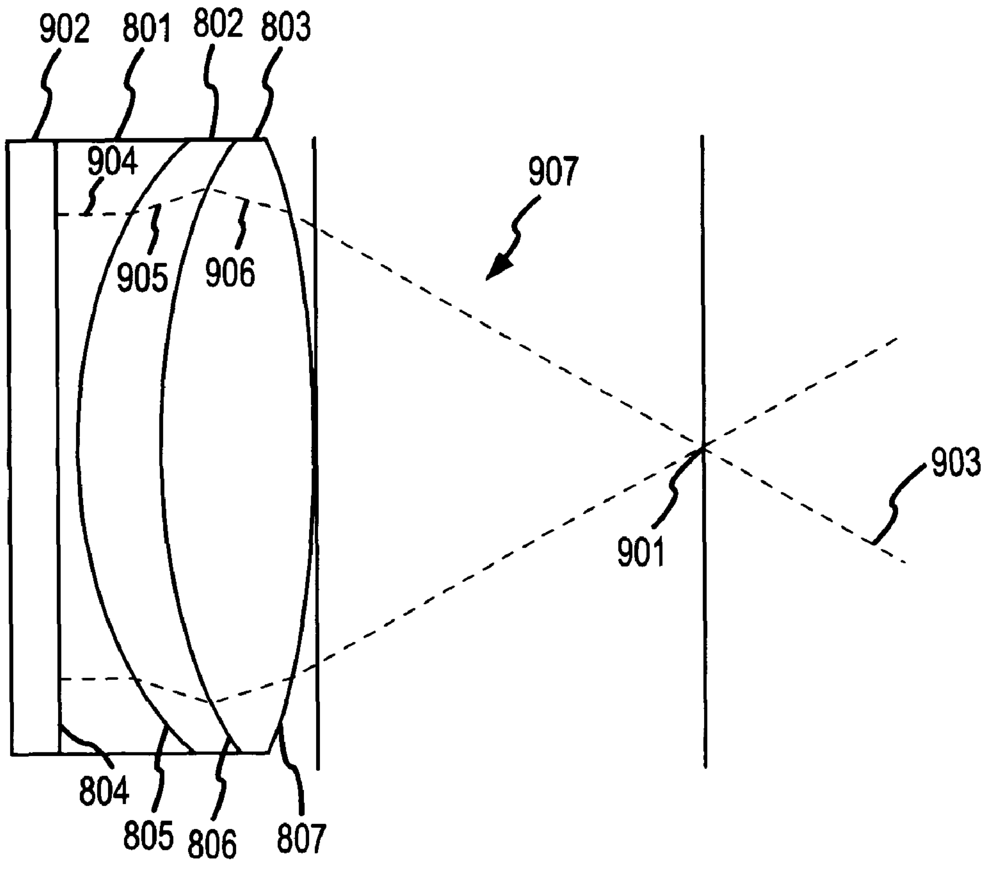
FIG. 9 schematically illustrates a cross sectional view of the ultrasonic transducer system of FIG. 8.

The ultrasonic transducer system 800 of FIG. 8 will now be described functionally with reference to FIG. 9. FIG. 9 illustrates a slice, or cross sectional view, through ultrasound transducer system 800 of FIG. 8 along an elevation axis 807 (as shown in FIG. 8) normal to a longitudinal axis. A unique quality of the ultrasonic transducer system 800 is that the degree of apodization, the curvature of the front surface 807 of the third lens element 803, and a focal point 901 of the ultrasonic transducer system 800 may all be adjusted independently of each other. For example, a curvature of the front surface 807 of the third lens element 803 may be selected to maximize patient comfort and the ability of the probe assembly to interface with the surface of the patient. Continuing with the current example, a desired degree of apodization of the acoustic wave emanating from the transducer 902 may be selected. This desired degree of apodization may require a certain radius of curvature of the front surface 805 of the first lens element 801 when using a material of determinable loss per unit thickness. With the radius of curvature of the front surface 805 of the first lens element 801 determined and the radius of curvature of the front surface 807 of the third lens element 803 determined, the radius of curvature of the front surface 806 of the second lens element 802 may then be selected to achieve the desired focal point 901.

The focusing and apodization of acoustic waves passing through the lens elements 801, 802 and 803 may be described as follows. An acoustic wave, as represented by ray trace 903, may be generated at the acoustic face 804 of the transducer 902. The acoustic wave may travel through the first lens element 801 perpendicular to the acoustic face 804 as illustrated by section 904 of the ray trace 903. The first lens element 801 may have a relatively high loss per unit thickness as compared to the second lens element 802. The relatively high loss material of the first lens element 801, along with the concave shape of the front surface 805 may result in a determinable degree of apodization of the acoustic wave as it passes through the first lens element 801. As discussed previously the degree of apodization may also be varied by varying the loss per unit thickness of the material. This may be accomplished by loading the material.

As the acoustic wave passes through the interface between the first lens element 801 and the second lens element 802, it may be defocused as illustrated by section 905 of the ray trace 903. This defocusing may be a result of the acoustic propagation velocity of the material of the first lens element 801 being lower than the acoustic propagation velocity of the material of the second lens element 802. However, this defocusing may be compensated for by proper selection of the radius of curvature of the interface between the second lens element 802 and the third lens element 803. Accordingly, as the acoustic wave passes through the interface between the second lens element 802 and the third lens element 803, it may be refracted as illustrated by section 906 of the ray trace 903. The acoustic wave may be further refracted as it passes through the interface between the third lens element 803 and the medium 907 directly adjacent to the third lens element 803. Typically, the medium of 907 is the area of a patient to be imaged.

In the ultrasound transducer system 800, apodization may be substantially accomplished within the first lens element 801, within the second lens element 802, or within a combination thereof. In an embodiment, the first lens element 801 has an acoustic loss per unit thickness of about 40 dB/cm at 1 MHz, the second lens element 802 has an acoustic loss per unit thickness of about 9 dB/cm at 1 MHz, and the third lens element 803 has an acoustic loss per unit thickness of about 2.7 dB/cm at 1 MHz. In an embodiment, the first lens element 801 has an acoustic propagation velocity of about 1,340 m/s, the second lens element 802 has an acoustic propagation velocity of about 1,680 m/s, and the third lens element 803 has an acoustic propagation velocity of about 1,020 m/s. By selecting properties such as lens element material loss per unit thickness, lens element radii of curvature, and lens element thickness, various loss and apodization profiles, including, for example, those described previously with respect to FIGS. 7A and 7B may be achieved.

Figure 10:
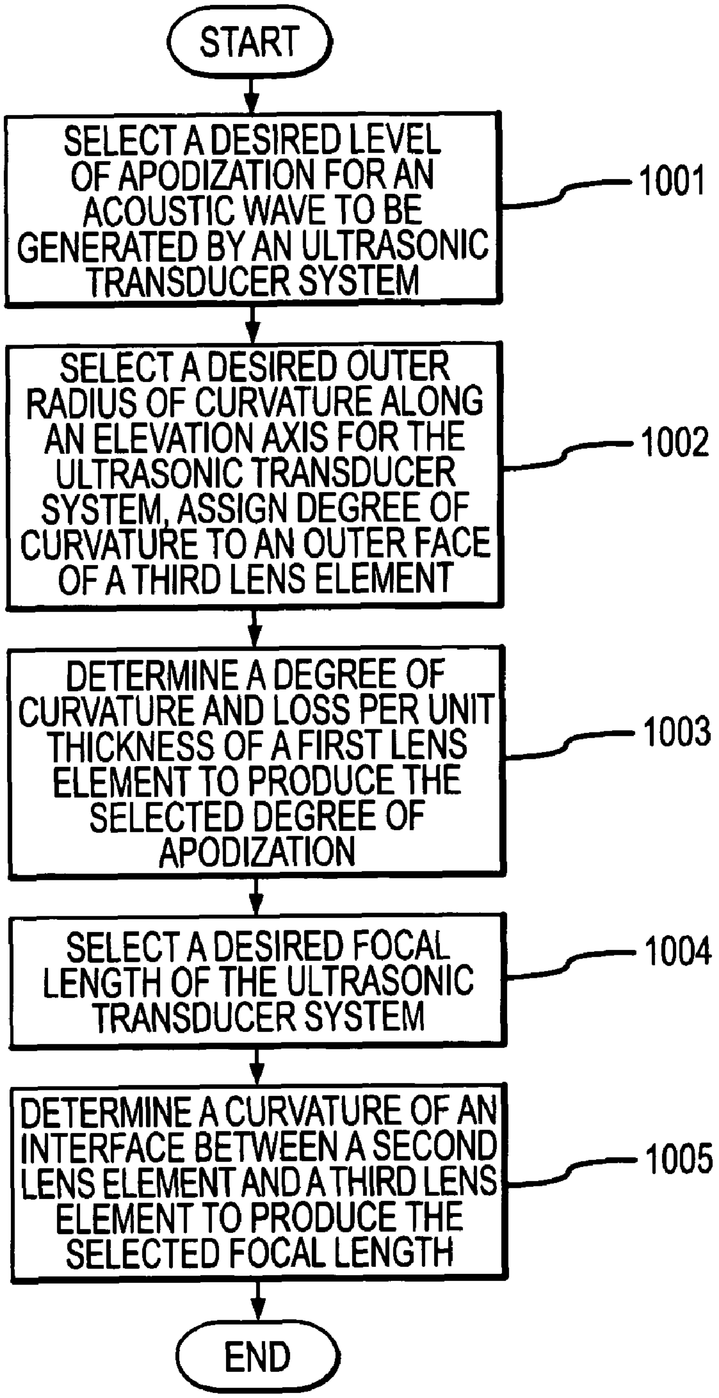
FIG. 10 is a flowchart illustrating an embodiment of a method of designing an acoustic lens for an ultrasonic transducer system.

FIG. 10 is a flow chart of a method of designing an ultrasound transducer system such as that illustrated in FIG. 8. The first step 1001 may be to select a desired level of apodization for an acoustic wave to be generated by an ultrasonic transducer system. The next step 1002 may be to select the desired outer radius of curvature about and along an elevation axis for the ultrasonic transducer system. This outer radius of curvature may be the degree of curvature of an outer face of a third lens element in the ultrasound transducer system being designed. The next step 1003 may be to determine a degree of curvature and loss per unit thickness of the first lens element which will in turn produce the degree of apodization selected during the first step 1001. This step 1003 may take into account the loss per unit thickness of the second and third lens elements. The next step 1004 may be to select a desired focal length of the ultrasonic transducer system. The next step 1005 may be to determine a curvature of the interface between a second lens element and the third lens element, which will produce the selected focal length. Step 1005 may be iterative in that the apodization properties of the second and third lens elements may not be exactly as assumed in step 1003 thus requiring a return to step 1003 to adjust the apodization of the acoustic wave.

Figure 11:
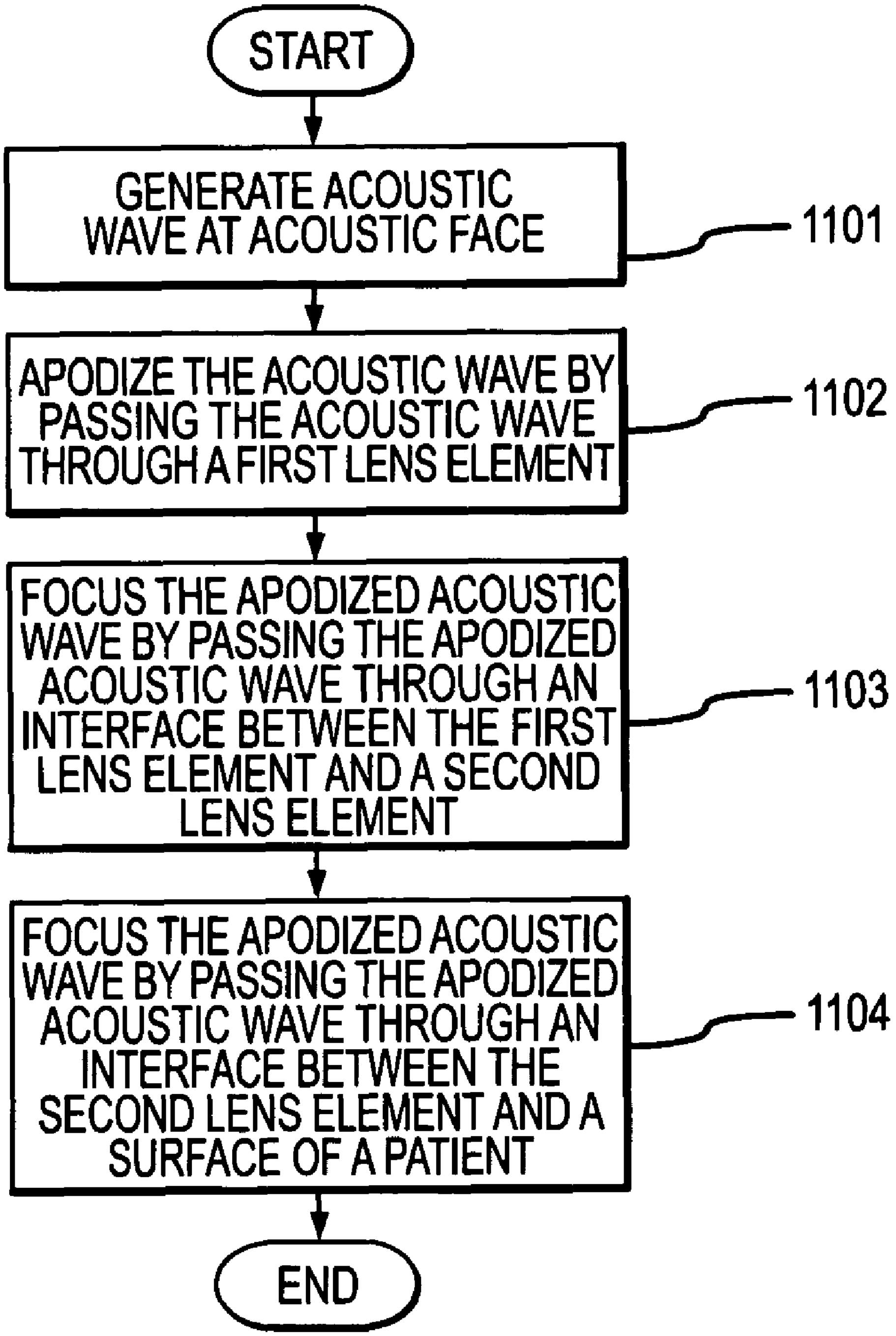
FIG. 11 is a flowchart illustrating an embodiment of a method of modifying an acoustic wave.

FIG. 11 is a flow chart of a method of modifying an acoustic wave. The first step 1101 may be to generate an acoustic wave at an acoustic face of an ultrasonic transducer. The next step 1102 in the method may be to apodize the acoustic wave by passing the acoustic wave through a first lens element. The following step 1103 may be to preliminarily focus the apodized acoustic wave by passing the apodized acoustic wave through an interface between the first lens element and a second lens element. This may be followed in step 1104 by further focusing the preliminarily focused apodized acoustic wave by passing the preliminarily focused apodized acoustic wave through an interface between the second lens element and a surface of a patient.

Figure 12:
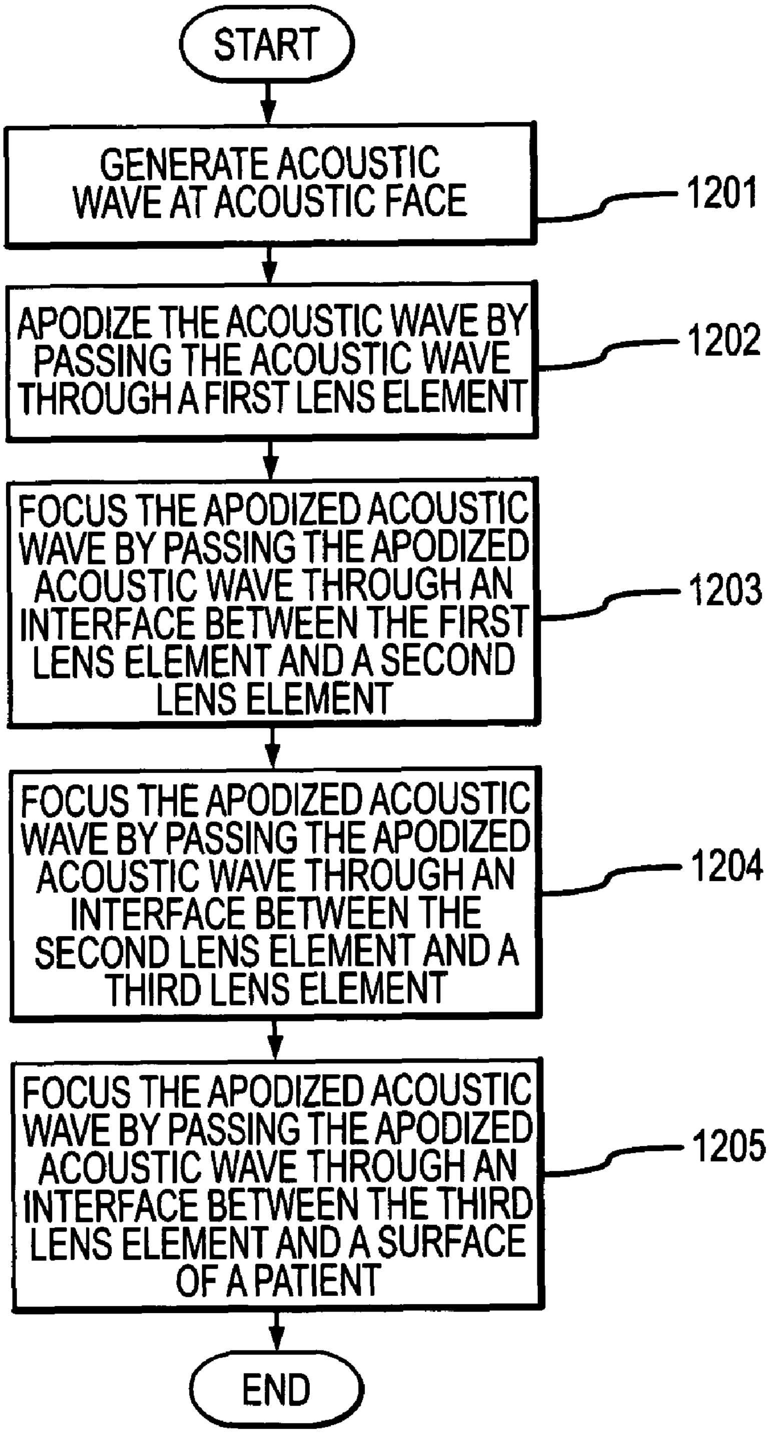
FIG. 12 is a flowchart illustrating an embodiment of a method of modifying an acoustic wave.

FIG. 12 is a flow chart of a method of modifying an acoustic wave. The first step 1201 may be to generate an acoustic wave at an acoustic face of an ultrasonic transducer. The next step 1202 in the method may be to apodize the acoustic wave by passing the acoustic wave through a first lens element. The following step 1203 may be to change the focus of the apodized acoustic wave by passing the apodized acoustic wave through an interface between the first lens element and a second lens element. The following step 1204 may be to further focus the apodized acoustic wave modified during step 1203 by passing the apodized acoustic wave through an interface between the second lens element and a third lens element. This may be followed by the step 1205 of further focusing the apodized acoustic wave modified during step 1204 by passing the apodized acoustic wave through an interface between the third lens element and a surface of a patient.

Although the above detailed description generally describes embodiments related to handheld ultrasonic probe assemblies, the present invention may also be utilized in other ultrasonic applications such as internal ultrasonic transducers (e.g., ultrasonic transducers in catheters) and therapeutic ultrasonic systems. The present invention may also be utilized in conjunction with curved transducer arrays, including transducer arrays curved in the elevation axis, the longitudinal axis, or any combination thereof.

Additionally, the improved performance and reduced transducer complexity as compared to known ultrasonic transducer systems makes embodiments describe herein particularly well-suited to replace existing ultrasonic transducer systems, either due to the failure of an existing ultrasonic transducer (e.g., a repair) or due to a desire to increase the imaging performance of a current ultrasonic imaging system (e.g., an upgrade) or due to a combination thereof.

Additional modifications and extensions to the embodiments described above will be apparent to those skilled in the art. Such modifications and extensions are intended to be within the scope of the present invention as defined by the claims that follow.

What is claimed is:

1. An ultrasonic transducer system comprising:

at least one ultrasonic transducer element having an acoustic face, said acoustic face having a first end, a second end, and a central point along an elevation axis, said central point being between said first end and said second end; and an acoustic lens acoustically coupled to said acoustic face, said acoustic lens comprising a first lens element and a second lens element, wherein said acoustic lens has an acoustic loss with respect to energy transmitted from each of said first end and said second end that is at least as great as an acoustic loss with respect to energy transmitted from said central point.

2. The ultrasonic transducer system of claim 1, wherein said at least one ultrasonic transducer element is planar.

3. The ultrasonic transducer system of claim 1, said acoustic lens comprising a first lens element and a second lens element, said first lens element having a back surface and a front surface, said back surface of said first lens element acoustically coupled to said acoustic face, said second lens element having a back surface and a front surface, said back surface of said second lens element acoustically coupled to said front surface of said first lens element.

4. The ultrasonic transducer system of claim 3, wherein said first lens element is comprised of polyurethane, wherein said second lens element is comprised of silicone rubber.

5. The ultrasonic transducer system of claim 4, wherein said first lens element is composed of substantially 100% polyurethane, wherein said second lens element is composed of substantially 100% silicone rubber.

6. The ultrasonic transducer system of claim 3, wherein said first lens element has an acoustic loss per unit thickness of at least about 0.2 db/cm at 1 MHz.

7. The ultrasonic transducer system of claim 3, wherein the ratio of acoustic loss per unit thickness of said first lens element to acoustic loss per unit thickness of said second lens element is at least about 2 to 1.

8. The ultrasonic transducer system of claim 3, wherein said first lens element provides for a first acoustic propagation velocity, wherein said second lens element provides for a second acoustic propagation velocity, wherein said first acoustic propagation velocity is greater than said second acoustic propagation velocity.

9. The ultrasonic transducer system of claim 3, wherein said first lens element is operable to apodize an acoustic signal.

10. The ultrasonic transducer system of claim 3, wherein said acoustic lens is operable to apodize an acoustic signal.

11. The ultrasonic transducer system of claim 3, wherein said acoustic lens is operable to substantially uniformly attenuate an acoustic signal.

12. The ultrasonic transducer system of claim 3, wherein said front surface of said first lens element is concave.

13. The ultrasonic transducer system of claim 3, wherein a thickness of said first lens element increases with distance along said elevation axis from said central point.

14. The ultrasonic transducer system of claim 3, wherein said front surface of said second lens element is one of flat and convex.

* * * * *